(12) United States Patent
Tseng

(10) Patent No.: US 6,319,771 B1
(45) Date of Patent: Nov. 20, 2001

(54) FABRICATION PROCESS FOR A LOWER ELECTRODE OF A MEMORY CAPACITOR

(75) Inventor: Horng-Huei Tseng, Hsinchu (TW)

(73) Assignee: Vanguard International Semiconductor Corp., Hsinchu (TW)

(*) Notice: Subject to any disclaimer, the term of this patent is extended or adjusted under 35 U.S.C. 154(b) by 0 days.

(21) Appl. No.: 09/620,842

(22) Filed: Jul. 21, 2000

(51) Int. Cl.[7] .................................... H01K 21/8242
(52) U.S. Cl. ........................ 438/255; 438/398; 438/964
(58) Field of Search ..................... 438/239–242, 438/253–256, 396–399, 964

(56) References Cited

U.S. PATENT DOCUMENTS 6,146,961 * 11/2000 Graettinger et al. ............... 438/396
6,261,190 * 7/2001 Tseng ................................ 438/255

* cited by examiner

Primary Examiner—John F. Niebling
Assistant Examiner—Jennifer M. Kennedy
(74) Attorney, Agent, or Firm—Jiawei Huang; J. C. Patents

(57) ABSTRACT

A fabrication process for a lower electrode of a memory capacitor, which process is performed on a substrate already having a first insulating layer formed thereon. First, a self-aligned contact opening is formed in a first insulating layer. The self-aligned contact opening exposes a conducting area on the substrate. A conformal first conductive layer is formed on the first insulating layer and in the self-aligned contact opening, the bottom of which functions as a contact. Then, the self-aligned contact opening is filled with a second insulating layer. The first conductive layer is back etched so as to remove completely the first conductive layer that is outside the self-aligned contact opening, and to remove to a certain depth the first conductive layer that is inside the self-aligned contact opening. A second conductive layer is then formed on the sidewalls of the first and second insulating layers that are located inside the self-aligned contact opening. The second conducting layer functions as a lower electrode of a capacitor.

20 Claims, 2 Drawing Sheets

FABRICATION PROCESS FOR A LOWER ELECTRODE OF A MEMORY CAPACITOR

BACKGROUND OF INVENTION

1. Field of the Invention

The present invention relates to a fabrication process for a memory device. More particularly, the present invention relates to a fabrication process for a lower electrode of a memory capacitor.

2. Description of the Related Art

A capacitor is an important component of a dynamic random access memory (DRAM). In order to avoid mistakes in information stored in the DRAM, and to increase the operation efficiency of the DRAM, a three-dimensional capacitor having a large area, such as the common cylinder capacitor, is usually fabricated.

The conventional fabrication process for a lower electrode of a cylinder capacitor is as follows. First, a first insulating layer is formed on the substrate. Then, a node contact that has electrical connection with the substrate is formed in the first insulating layer. Afterwards, a second insulating layer is formed on the first insulating layer. An opening which exposes the node contact is provided in the second insulating layer. Then, a conductive layer, which functions as the lower electrode of the cylinder capacitor, is formed on the inner wall and the bottom of the opening. In the conventional fabrication process for a lower electrode of a cylinder capacitor, the template that forms the node contact and the lower electrode of a cylinder capacitor and the opening of the second insulating layer each require a photomask process. Thus two photomask processes are necessary. As a result, the conventional process not only wastes time, but also easily causes alignment problems.

SUMMARY OF THE INVENTION

The present invention provides a fabrication process for a lower electrode of a cylinder capacitor whose surface area is larger than that provided by the conventional technology and only requires one photomask process. The steps of the process are as follows. A first insulating layer is formed on a substrate. A self-aligned contact opening is formed in the first insulating layer, which opening exposes a conducting area on the substrate. Then, the first conductive layer is formed on the first insulating layer and in the self-aligned contact opening. The first conductive layer is conformal to the first insulating layer having the self-aligned contact opening. At this point the first conductive layer below the self-aligned contact opening is a contact. Afterwards, the self-aligned contact opening is filled with a second insulating layer and the first conductive layer is back-etched in order to remove completely the first conductive layer that is outside the self-aligned contact opening and to remove the first conductive layer to a certain depth inside the self-aligned contact opening. Afterwards, the second conductive layer is formed on the sidewalls of the first and the second insulating layers that are in the self-aligned contact opening. This second conductive layer functions as a lower electrode of a capacitor.

As described above, in the fabrication process for a lower electrode of a memory capacitor according to the present invention, the second conductive layer that functions as the main body of a lower electrode of a memory capacity is formed not only on the inner sidewall of the self-aligned contact opening, but also on the sidewall of second insulating layer that is at the center of the self-aligned contact opening. Therefore, the surface area of the lower electrode of the memory capacitor obtained through the process according the present invention is larger than that of the lower electrode of a cylinder capacitor obtained through the conventional process. In addition, because the template of the lower electrode of the capacitor in the present process is the upper part of the self-aligned contact opening, the forming of the node contact and the lower electrode of the capacitor requires only one photomask process for defining the self-aligned contact opening.

It is to be understood that both the foregoing general description and the following detailed description are exemplary and explanatory, only, and are not restrictive of the invention as claimed.

BRIEF DESCRIPTION OF THE DRAWINGS

The accompanying drawings are included to provide a further understanding of the above described objects, characteristics, and advantages of the invention. The drawings illustrate a preferred embodiment of the invention and, together with the description, serve to explain the principles of the invention. In the drawings, FIGS. 1A to 1E (1E') show the preferred embodiment of the fabrication process for a lower electrode of memory capacitor, according the present invention.

DESCRIPTION OF THE PREFERRED EMBODIMENTS

Figure 1A:
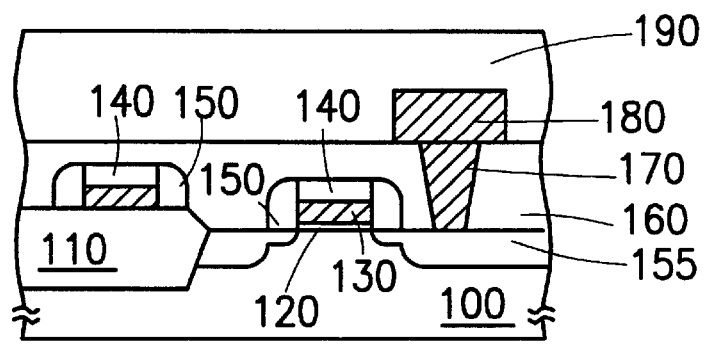

FIGS. 1A to 1E (1E') illustrate the fabrication process for a lower electrode of a memory capacitor in a preferred embodiment of the invention.

With reference to FIG. 1, a substrate 100 is provided, in which substrate 100 a shallow trench isolation (STI) layer 110 is formed. A gate dielectric layer 120 is formed on the substrate 100. On top of the gate dielectric layer 120 is formed a word line 130, and on the word line 130 is formed a cap layer 140. Spacers 150 are formed on both sidewalls of the word line 130 and the cap layer 140. The material for the cap layer 140 and the spacers 150 can be silicon nitride (SiN). A source and drain region 155 is formed in the substrate 100 on both sides of the gate comprising gate dielectric layer 120, word line 130 and cap layer 140 to produce a metal oxide semiconductor (MOS). An insulating layer 160 is formed on the substrate 100, a bit line contact 170 is formed in the insulating layer 160 and a bit line 180 is formed on the insulating layer 160. The substrate 100 is covered with an insulating layer 190. The etching rate of the material used for the insulating layers 190 and 160 is much higher than the etching rate of the cap layer 140 and the spacers 150. This is favorable to the following process for a self-aligned contact. That is, when the material for the cap layer 140 and the spacers 150 is silicon nitride, the material of the layers 190 and 160 can be silicon oxide, whose etching rate is much higher than silicon nitride.

Figure 1B:
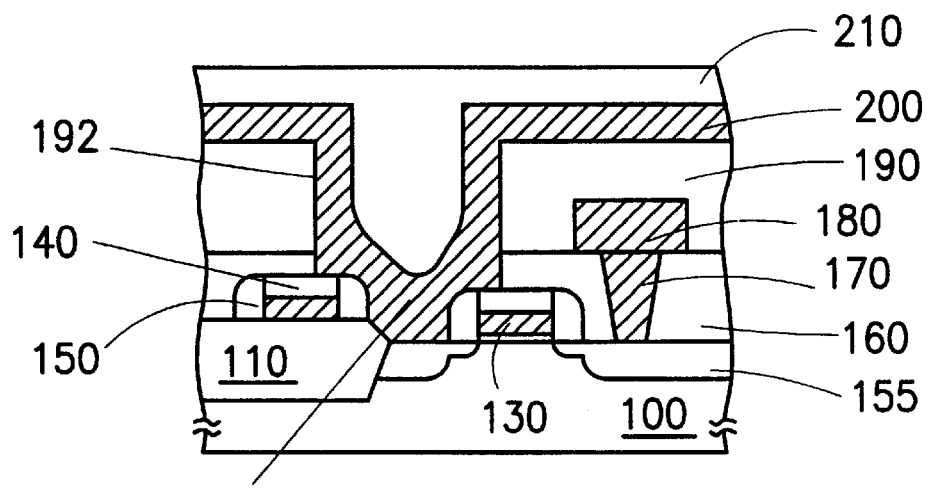

FIG. 1B shows that afterwards, a self-aligned contact opening 192 is formed in the insulating layers 190 and 160 to expose the source and drain region. Then a conductive layer 200 is formed on the insulating layer 190 and in the self-aligned contact opening 192. The conductive layer 200 conformal to the self-aligned contact opening 192. The material for the conductive layer 200 is, for example, polysilicon. At this point, the conductive layer 200 at the bottom of the self-aligned contact opening 192 becomes a node contact 200a. Then an insulating layer 210 is formed on the conductive layer 200. The insulating layer 210 fills up the self-aligned contact opening 192.

Figure 1C:
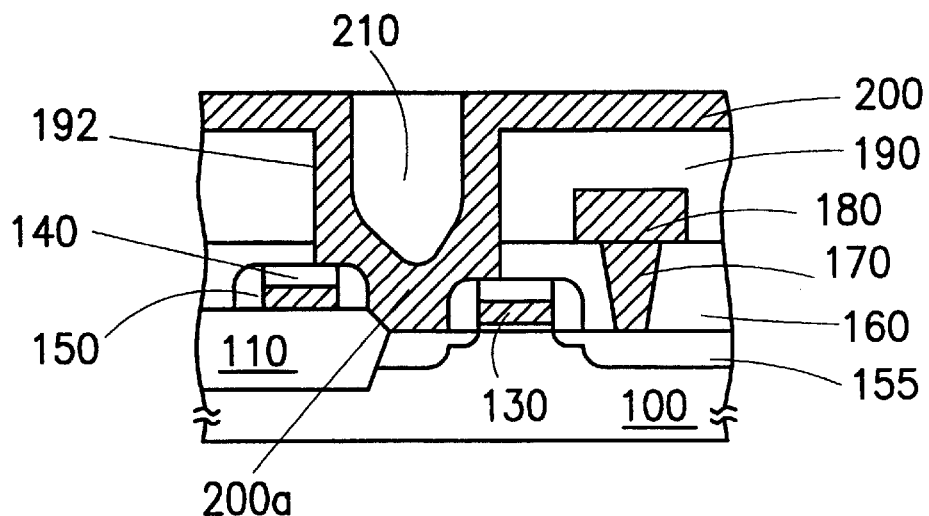

With reference to FIG. 1C, the part of the insulating layer 210 that is outside the self-aligned contact opening 192 is removed by way of, for example, plasma etch or chemical mechanical polishing (CMP).

Figure 1D:
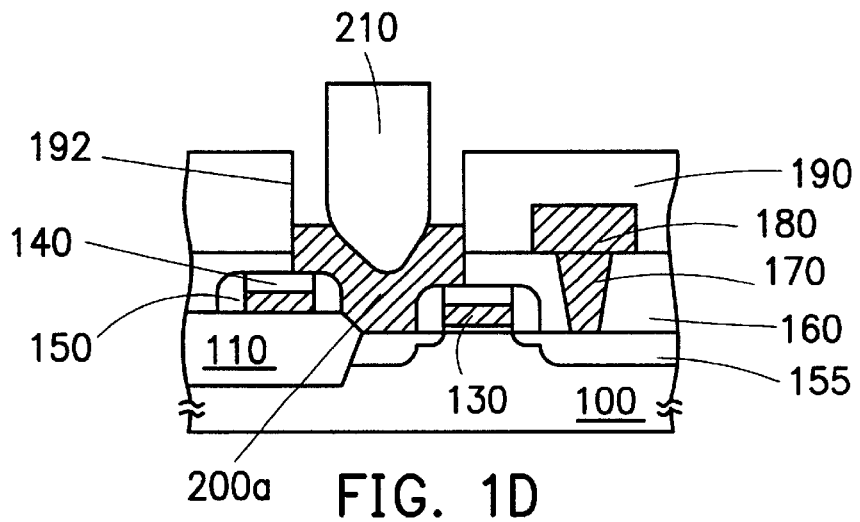

With reference to FIG. 1D, back etching is conducted on the conductive layer 200 by way of plasma etch, for example, in order to remove completely the part of the conductive layer 200 that is outside the self-aligned contact opening 192 and to continue to remove the conductive layer 200 inside the self-aligned contact opening 192 to a certain depth.

Figure 1E:
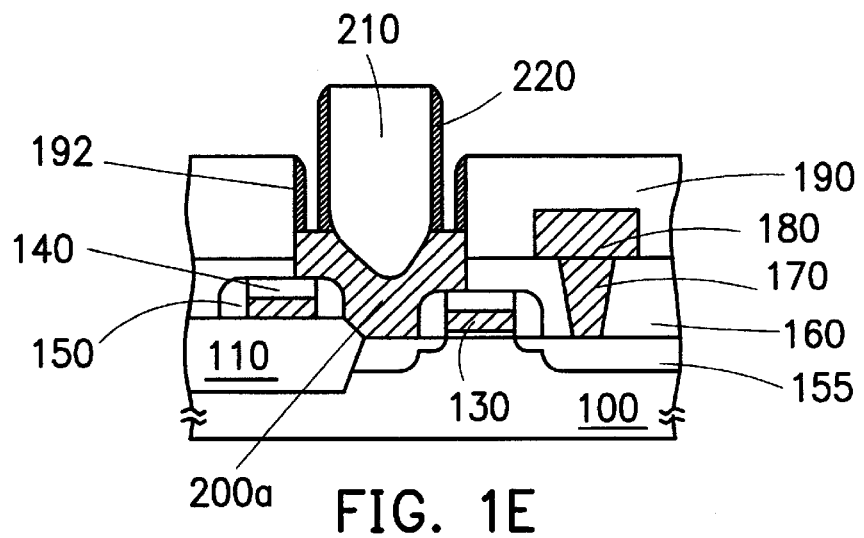
Figure 1E:
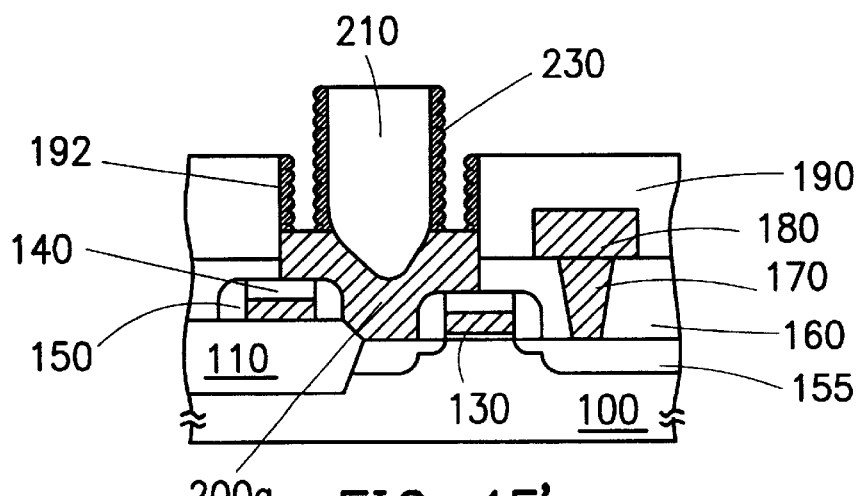

The subsequent step can be completed in one of two ways, described respectively with reference to FIG. 1E and FIG. 1E'.

With respect to FIG. 1E, a conformal conductive layer (not shown in the drawing) is formed on the substrate 100. The material for the conductive layer is polysilicon, for example. Then, the conductive layer on the top surface of the insulating layers 190 and 210 and on the surface of the nodal contact 200a is removed by way of plasma etching, for example, so that the remaining conductive layer becomes the lower electrode of a capacitor 220.

An alternative way is shown in FIG. 1E'. A layer with an amount of hemispherical grained silicon sufficient to cover completely the surface of the substrate 100 is formed on the substrate (not shown in the drawing). Then, the part of the hemispherical grain silicon layer that is on the top surface of the insulating layers 190 and 210 and on the surface of the nodal contact 200a is removed by way of plasma etching, for example. Thus the remaining hemispherical grain silicon layer becomes the lower electrode of a capacitor 230, whose surface area is even bigger than that of the above-described lower electrode of a capacitor 220.

With reference to both FIG. 1E and FIG. 1E', in the above-described fabrication process for a lower electrode of a memory capacitor as shown in the preferred embodiment of the present invention, the lower electrode 220 (230) of a capacitor is formed not only on the inner sidewall of the self-aligned contact opening 192, but also on the sidewall of the insulating layer 210 that is in the middle of the self-aligned contact opening 192. Therefore, the area of the lower electrode 220 (230) obtained through the present process is larger than the area of the lower electrode of the cylinder capacitor obtained through the conventional process. In addition, because the template of the lower electrode 220 (230) of the capacitor in the present process is the upper part of the self-aligned contact opening 192, the forming of the node contact and the lower electrode of the capacitor requires only one photomask process for defining the self-aligned contact opening.

Although the present invention is disclosed above with a preferred embodiment, it will be apparent to those skilled in the art that various modifications and variations can be made to the present invention without departing from the scope or spirit of the invention. In view of the foregoing, it is intended that the present invention cover modifications and variations of this invention provided they fall within the scope of the following claims and their equivalents.

What is claimed is:

1. A fabrication process for a lower electrode of a memory capacitor, comprising:

forming a first insulating layer on a substrate;

forming a self-aligned contact opening in the first insulating layer, wherein the self-aligned contact opening exposes a conducting area on the substrate;

forming a conformal first conductive layer on the first insulating layer and in the self-aligned contact opening;

filling the self-aligned contact opening with a second insulating layer;

back-etching the first conductive layer so as to remove completely a part of the first conductive layer that is outside the self-aligned contact opening and to remove a part of the first conductive layer that is inside the self-aligned contact opening to a certain depth; and forming a second conductive layer only on sidewalls of the first and second insulating layers inside the self-aligned contact opening, wherein the second conductive layer functions as a lower electrode of a capacitor.

2. The process of claim 1, wherein filling the self-aligned contact opening with the second insulating layer further comprises:

forming the second insulating layer on the first conductive layer and in the self-aligned contact opening, wherein the second insulating layer fills the self-aligned contact opening; and removing a part of the second conductive layer that is outside the self-aligned contact opening.

3. The process of claim 2, wherein the part of the second conductive layer that is outside the self-aligned contact opening is removed by plasma etching.

4. The process of claim 2, wherein the part of the second conductive material that is outside the self-aligned contact opening is removed by chemical mechanical polishing.

5. The process of claim 1, wherein the first conductive layer is back-etched by plasma etching.

6. The process of claim 1, wherein forming the second conductive layer on the sidewalls of the first and the second insulating layers in the self-aligned contact opening further comprises:

forming a conformal second conductive layer on the substrate; and removing the second conductive layer on top surfaces of the first and the second insulating layers.

7. The process of claim 6, wherein the second conductive layer on the top surfaces of the first and the second insulating layers is removed by plasma etching.

8. The process of claim 1, wherein the second conductive layer is a polysilicon layer.

9. The process of claim 1, wherein the second conductive layer is a hemispherical grained silicon layer.

10. The process of claim 1, wherein the first conductive layer is a polysilicon layer.

11. A fabrication process for a lower electrode of a memory capacitor, comprising:

forming a metal oxide semiconductor (MOS) on a substrate;

forming a first insulating layer on the MOS;

forming a bit line contact in the insulating layer;

forming a bit line on the first insulating layer;

forming a second insulating layer on the bit line and the first insulating layer;

forming a self-aligned contact opening in the second and the first insulating layers, wherein the self-aligned contact opening exposes a source and drain region of the MOS;

forming a conformal first conductive layer on the second insulating layer and in the self-aligned contact opening;

filling the self-aligned contact opening with a third insulating layer;

back-etching the first conductive layer to remove completely the first conductive layer that is outside the self-aligned contact opening and to remove the first conductive layer in the self-aligned contact opening to certain depth; and forming a second conductive layer on sidewalls of the second and the third insulating layers that are inside the self-aligned contact opening, wherein second conductive layer is a lower electrode of a capacitor.

12. The process of claim 11, wherein filling the self-aligned contact opening with the third insulating layer further comprises:

forming the third insulating layer on the first conductive layer and in the self-aligned contact opening, wherein the third insulating layer fills the self-aligned contact opening; and removing a portion of the third insulating layer that is outside the self-aligned contact opening.

13. The process of claim 12, wherein the portion of the third insulating layer outside the self-aligned contact opening is removed by plasma etching.

14. The process of claim 12, wherein the portion of the third insulating layer outside the self-aligned contact opening is removed by chemical mechanical polishing.

15. The process of claim 11, wherein the first conductive layer is back-etched by plasma etching.

16. The process of claim 11, wherein forming the second conductive layer on the sidewalls of the second and the third insulating layers in the self-aligned contact opening further comprises:

forming a conformal second conductive layer on the substrate; and removing the second conductive layer on top surfaces of the second and the third insulating layers.

17. The process of claim 16, wherein the second conductive layer on the top surfaces of the second and the third insulating layers is removed by plasma etching.

18. The process of claim 11, wherein the second conductive layer is a polysilicon layer.

19. The process of claim 11, wherein the second conductive layer is a hemispherical grained silicon layer.

20. The process of claim 11, wherein the first conductive layer is a polysilicon layer.

* * * * *